United States Patent
Rudolph et al.

(10) Patent No.: US 11,749,638 B2
(45) Date of Patent: Sep. 5, 2023

(54) METHOD FOR CONTACTING AND PACKETISING A SEMICONDUCTOR CHIP

(71) Applicant: Technische Universität Chemnitz, Chemnitz (DE)

(72) Inventors: Johannes Rudolph, Bad Lausick (DE); Fabian Lorenz, Chemnitz (DE); Ralf Werner, Chemnitz (DE); Peter Seidel, Chemnitz (DE)

(73) Assignee: Technische Universität Chemnitz, Chemnitz (DE)

( * ) Notice: Subject to any disclaimer, the term of this patent is extended or adjusted under 35 U.S.C. 154(b) by 231 days.

(21) Appl. No.: 16/965,603

(22) PCT Filed: Jan. 29, 2019

(86) PCT No.: PCT/DE2019/100092
§ 371 (c)(1),
(2) Date: Nov. 10, 2020

(87) PCT Pub. No.: WO2019/161833
PCT Pub. Date: Aug. 29, 2019

(65) Prior Publication Data
US 2022/0181291 A1 Jun. 9, 2022

(30) Foreign Application Priority Data
Feb. 23, 2018 (DE) .......................... 102018104144.6

(51) Int. Cl.
*H01L 23/00* (2006.01)
(52) U.S. Cl.
CPC .............. *H01L 24/82* (2013.01); *H01L 24/25* (2013.01); *H01L 2224/04105* (2013.01);
(Continued)

(58) Field of Classification Search
CPC ......... H01L 24/82; H01L 24/25; H01L 21/58; H01L 21/60; H01L 23/485;
(Continued)

(56) References Cited

U.S. PATENT DOCUMENTS

2010/0044885 A1* 2/2010 Fuergut ............... H01L 23/5389
257/784
2012/0222736 A1* 9/2012 Gee ................. H01L 31/022433
257/E31.124
(Continued)

FOREIGN PATENT DOCUMENTS

| DE | 102006008332 A1 | 1/2007 |
| DE | 102016107031 A1 | 10/2017 |
| WO | 2009034557 A2 | 3/2009 |

*Primary Examiner* — Didarul A Mazumder
(74) *Attorney, Agent, or Firm* — Michael Soderman

(57) ABSTRACT

A method for contacting and packaging a semiconductor chip of a power electronic component. The power electronic component has a first contact face produced in a first step via a multi-material printing process and a semiconductor chip, which is placed in a second step onto the first contact face. A ceramic insulation layer, which surrounds the semiconductor chip along its circumference and extends over the first contact face not covered by the semiconductor chip, is printed in a third step onto the first contact face. A second contact face is printed in a fourth step onto the ceramic insulation layer and the semiconductor chip. In a fifth step, the power electronic component is sintered by means of heat treatment.

5 Claims, 8 Drawing Sheets

(52) U.S. Cl.
CPC ........... *H01L 2224/06181* (2013.01); *H01L 2224/2518* (2013.01); *H01L 2224/8284* (2013.01); *H01L 2224/82104* (2013.01); *H01L 2924/13091* (2013.01)

(58) Field of Classification Search
CPC . H01L 2224/04105; H01L 2224/06181; H01L 2224/2518; H01L 2224/82104; H01L 2224/8284; H01L 2924/13091
USPC .......................................................... 438/122
See application file for complete search history.

(56) References Cited

U.S. PATENT DOCUMENTS

| | | | | |
|---|---|---|---|---|
| 2014/0054780 | A1* | 2/2014 | Fuergut | H01L 23/498 257/777 |
| 2014/0110828 | A1* | 4/2014 | Otremba | H01L 23/49562 438/122 |

* cited by examiner

METHOD FOR CONTACTING AND PACKETISING A SEMICONDUCTOR CHIP

CROSS REFERENCE TO RELATED APPLICATIONS

This application is the U.S. national stage of International Application No. PCT/DE2019/100092, filed on 2019 Jan. 29. The international application claims the priority of DE 102018104144.6 filed on 2018 Feb. 23; all applications are incorporated by reference herein in their entirety.

BACKGROUND

The invention relates to a method for contacting and packaging a semiconductor chip and is used in particular for contacting and packaging semiconductors by means of 3D multi-material printing.

According to the prior art, methods for contacting semiconductors are known, wherein the underside of the semiconductor is contacted by placing a chip onto a metal surface and then sintering while applying additional mechanical pressure. The contact thus established provides a thermal and electrical connection of good quality.

The upper side, in contrast, is contacted by means of bond wires. Compared to the underside, however, the electrical and thermal connection is poorer, resulting in a loss of quality.

Document WO 2009/034557 A2 discloses a method for producing structures with integrated electrical elements such as semiconductor chips. The method relates to the implementation of arbitrary structures for providing an electrical connection and a mechanical fastening for integrated circuits. According to said document, structures are produced using three-dimensional production processes which use only additive steps for all materials within the structure. The structure is created in a single method step, with the mechanical, electrical and thermal properties necessary for the design being introduced in the method step. The structure can comprise dielectric and metal materials. The structures can be produced directly in conjunction with the integrated circuits or separately for subsequent mounting on the integrated circuits.

Document DE 10 2006 008 332 A1 discloses a method for producing a functional assembly, as well as a functional assembly. The method provides that a functional assembly is produced by applying a first and second material layer by layer. The first material and the second material have different properties, with an encapsulation being created from the first material and a strip conductor structure being created from the second material. While the materials are being applied, one or more functional units are embedded in the layer structure and are contacted with the strip conductor structure.

A laminate package consisting of a chip and a carrier in a cavity is disclosed in document DE 10 2016 107 031 A1. According to the exemplary embodiment, a laminate package is provided which comprises a chip carrier made of a first material and a body made of a second material, the first material differing from the second material. The first and second material are arranged on the chip carrier in such a way that they form a cavity. At least part of the semiconductor chip is arranged in the cavity. The laminate encapsulates at least part of the chip carrier, at least part of the body and at least part of the semiconductor chip. To reduce costs, the cavity can be produced by means of additive processes.

SUMMARY

The invention involves a method for contacting and packaging a semiconductor chip (2) of a power electronic component. The power electronic component has a first, lower contact face (1) and a semiconductor chip (2) positioned thereon, characterized in that a ceramic insulation layer (3), which surrounds the semiconductor chip (2) along its circumference and extends over the first contact face (1) not covered by the semiconductor chip (2), is printed onto the lower contact face (1). It is also characterized in that a second, upper contact face (4) is printed onto the ceramic insulation layer (3) and the semiconductor chip (2). The first and second contact face (1, 4) and the ceramic insulation layer (3) are created in a printing process by means of a 3D multi-material printer such that in a first method step the first contact face (1) is produced by means of the multi-material printing process,
in a second method step the semiconductor chip (2) is placed onto the first, lower contact face (1),
in a third method step a ceramic insulation layer (3), which surrounds the circumference of the semiconductor chip (2), is printed onto the first contact face (1),
in a fourth method step the second contact face (4) is printed onto the ceramic insulation layer (3) and the semiconductor chip (2),
in a fifth method step the power electronic component is sintered by means of heat treatment.

DETAILED DESCRIPTION

The problem addressed by the invention is that of developing a method for contacting and packaging a semiconductor chip which ensures a simple construction and a good quality of the electrical and thermal connection of the semiconductor chip.

This problem is solved by the characterizing features of the first and tenth claim.

Advantageous embodiments will emerge from the dependent claims.

The invention relates to a method for contacting a semiconductor chip of a power electronic component, wherein the power electronic component has a first, lower contact face and a semiconductor chip positioned thereon. A ceramic insulation layer, which surrounds the semiconductor chip along its circumference, is printed onto the lower contact face. The ceramic insulation layer is designed such that it extends over the area of the first, lower contact face that is not covered by the semiconductor chip. In a subsequent step, a second, upper contact face is printed onto the ceramic insulation layer and the semiconductor chip, which second, upper contact face covers the semiconductor chip and corresponds in its external dimensions to the dimensions of the first contact face and the insulation layer.

In order to achieve the best possible result, the method according to the invention comprises preferably five method steps.

In a first method step a first, lower contact face is produced by means of a 3D multi-material printing process.

Thereafter, the semiconductor chip is oriented and positioned on the first, lower contact face by means of a "pick and place" method.

The third method step comprises the application of a ceramic insulation layer by means of the 3D multi-material printing process. The ceramic insulation layer is applied to or printed on the first, lower contact face in a plane such as to surround the circumference of the semiconductor chip.

In a fourth method step the second contact face is printed onto the face formed of the ceramic insulation layer and the upper side of the semiconductor chip.

Finally, the package thus created, which as described above contains the semiconductor chip, is sintered by means of heat treatment in a fifth method step.

In one advantageous embodiment, the first and the second contact face and also the ceramic insulation layer are created in a printing process by means of a 3D multi-material printer. The height of the ceramic insulation layer substantially corresponds to the height of the semiconductor chip, as a result of which a flat surface consisting of the upper side of the semiconductor chip and the ceramic insulation layer is formed as a support for the second, upper contact face.

Preferably, one or more cutouts for additional connections are made in the second contact face. This is important for example for power electronic components. Connections in the form of gate contacts can thus be created when producing a field-effect transistor. In particular, mention may be made here of metal-oxide-semiconductor field-effect transistors (MosFets).

A connection as an additional contact is insulated from the second contact face in such a way that the connection is surrounded around the circumference by the ceramic insulation layer such that the ceramic insulation layer in the region of the connection extends up to the upper side of the second contact face. The circumferential insulation of the connection and also the additional connection can be created in the same method step as the printing of the upper, second contact face by means of multi-material printing. The connection in the form of the cutout contains electrically conductive printed structures which, by means of suitable ceramic structures, are electrically insulated from the surrounding second contact face by means of the ceramic.

The first contact face and the second contact face are produced from a conductive material, the first contact face being produced in particular from copper.

In one advantageous embodiment, in a further method step, a housing for the semiconductor chip is created by means of the printing process. The housing may be designed such that it has cooling functionalities, which are introduced while creating the housing.

Due to the good thermal connection of the semiconductor chip to the first and second contact face, electrical power losses that occur can be better transported to the outside. The use of ceramic insulation materials significantly increases this effect, since these have much higher thermal conductivities than plastic packaging.

A power electronic component produced by the method according to the invention comprises a semiconductor chip, the semiconductor chip being positioned on a first, lower contact face. A ceramic insulation layer which surrounds the semiconductor chip is arranged on the lower contact face and substantially corresponds to the height of the semiconductor chip. and has a second contact face arranged on the semiconductor chip and the ceramic insulation layer, wherein the layers can be produced within a printing process.

The power electronic component preferably has at least one additional connection in the upper contact face, wherein the connection is insulated from the second, upper contact face by means of a ceramic insulation layer, which surrounds the circumference of the connection. The ceramic insulation layer is formed in one piece.

The invention will be described in greater detail below on the basis of an exemplary embodiment and associated drawings.

DETAILED DESCRIPTION OF THE PREFERRED EMBODIMENTS

Figure 1:
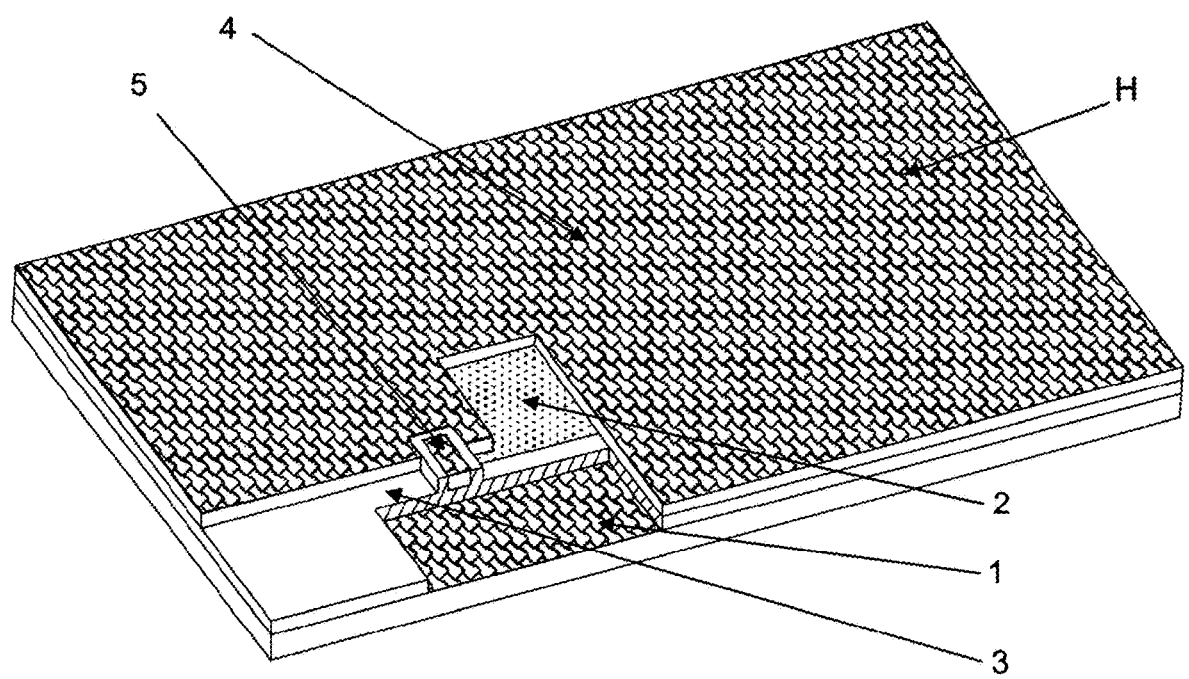
FIG. 1 shows a schematic illustration of the layer structure of the power electronic component.
Figure 2:
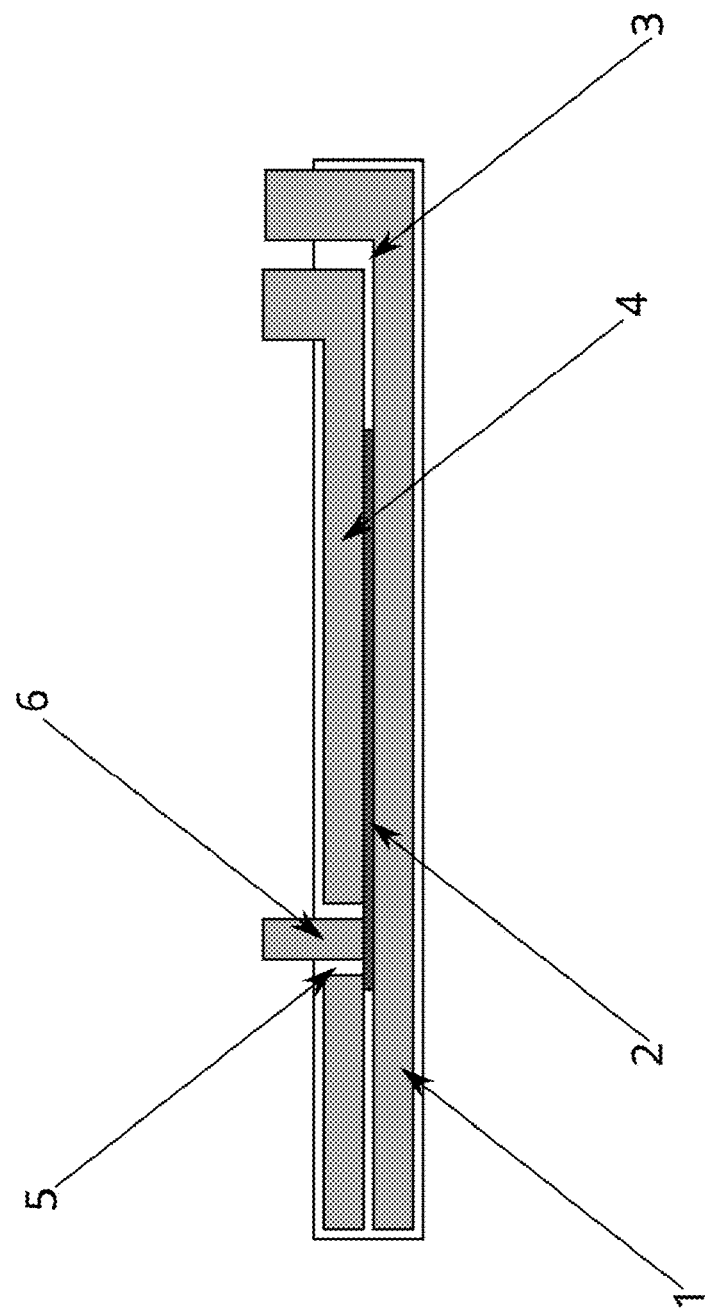
FIG. 2 shows the elements in the power electronic component in a cross-sectional view.
Figure 3:
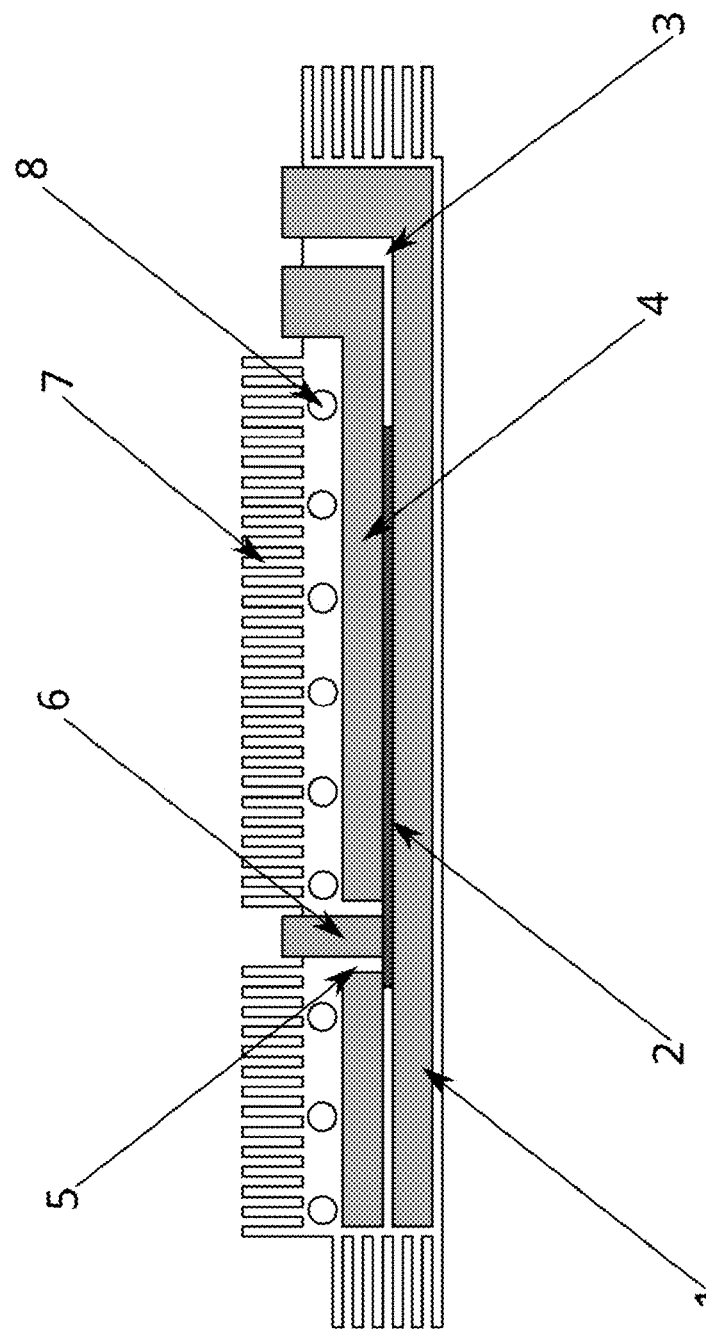
FIG. 3 shows a housing for the semiconductor for the semiconductor chip with cooling functionalities, FIG. 4 *a*) to *e*)/*e*1) Steps up to the placement of the semiconductor chip, FIG. 5 *f*) to *h*)/*h*1) Steps up to the covering of the connections with conductive material—in this case copper—and closing the gaps between the connections with ceramic, FIG. 6A *i*) to *g*) Steps for completing the power electronic component, FIG. 6B *r*) to *x*) Further steps for completing the power electronic component, FIG. 7 Power electronic component in 3D view, FIG. 8 Further variant of a power electronic component.

The power electronic component H in accordance with the method according to the invention is shown in FIG. 1. The power electronic component has a first, lower contact face 1 and a semiconductor chip 2 arranged thereon, preferably by means of a "pick and place" method. The lower contact face 1 is produced from copper, in particular by means of 3D multi-material printing.

Extending over the first, lower contact face 1 is a ceramic insulation layer 3 which is applied by means of the printing process, said layer surrounding the semiconductor chip 2 along its circumference and embedding it in the insulation layer 3. The insulation layer 3 extends over the area of the contact face 1 that is not covered by the semiconductor chip 2. The ceramic insulation layer 3 substantially has a height corresponding to the height of the semiconductor chip 2, thereby creating a flat surface. A second, upper contact face 4 is arranged on the ceramic insulation layer 3 by means of the 3D multi-material printing process.

As shown in FIG. 1, the second contact face 4 has a cutout 5, which is designed in the form of an additional connection 6 or contact. The cutout 5 is insulated from the upper, second contact face 4 by means of the ceramic insulation layer 3, which surrounds the circumference of said cutout. The ceramic insulation layer 3 extends around the connection 5 in some regions, encapsulating it up to the height of the upper side of the upper contact face 4. Either one or multiple cutouts 5 may be provided in the upper contact face 4.

The cutout 5 and the ceramic insulation layer 3 may be applied together with the second contact face 4 in one method step. An additional connection 6 thus created is important for power electronic components. In this way, one or multiple connections 6 in the form of gate contacts can be created when producing a field-effect transistor.

A process variant for manufacturing a power electronic component is described is described in FIGS. 4 to 6A and 6B.

Figure 4:
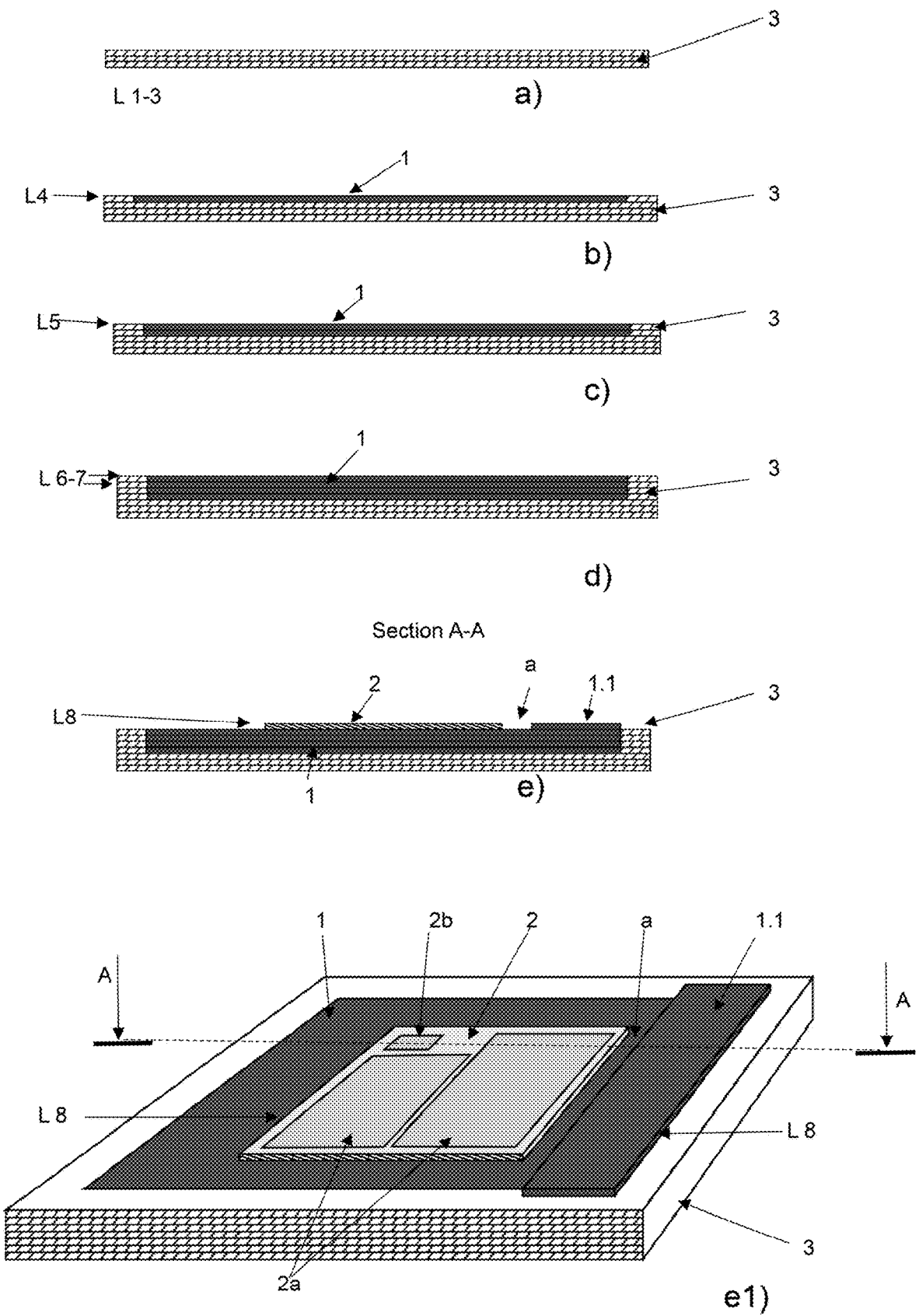

According to FIG. 4, in a preliminary step and prior to the creation of the contact face 1, a layer of a ceramic insulation layer 3 is first created here via a 3D multi-material printing process, which consists of three layers L1 to L3 (ceramic in this case) and forms the underside of the subsequent housing.

Then, in the first process step 1 according to the first patent claim, in accordance with the sectional views of steps b) to d), the lower contact face 1 made of electrically conductive material (here copper) is also applied to the insulation layer 3 via a 3D multi-material printing process, in several layers L4 to L7 here, and the contact face 1 is surrounded with a ceramic insulation layer 3 on its outside, also via 3D multi-material printing. The peripheral ceramic insulation layer 3 later forms the side wall of the housing.

Subsequently, according to the second process step 2 in a layer L8, the semiconductor chip 2 is positioned with its underside on the electrically conductive contact face 1. In addition, a further layer 1.1 of electrically conductive material (copper) is applied here at a distance a from the semiconductor chip 2. This is shown in section A-A according to illustration e1) and in three dimensions in illustration e1.

Diagram e.1) shows that the semiconductor chip 2 in this example has two source contacts 2a and one gate contact 2b. The number of source contacts of the semiconductor chip may vary.

In the third process step 3. according to the first patent claim, a ceramic insulation layer 3 is applied to the contact face 1 via 3D multi-material printing in the layer L8 corresponding to the height of the semiconductor chip 2, and the semiconductor chip 2 is enclosed at its circumference by the ceramic insulation layer 3. Since its height essentially corresponds to the height of the semiconductor chip 2, a flat surface is formed from the upper side of the semiconductor chip 2 and the ceramic insulation layer 3 as well as the electrically conductive structure in the form of layer 1.1 as a support for the second upper contacting face 4 and the additional connection 6. The ceramic insulation layer 3 also separates the semiconductor chip 2 from the layer 1.1 of electrically conductive material (copper) and also encloses the layer 1.1 according to FIG. 5 (section B-B according to depictions f) and f1). The top surfaces of the semiconductor chip 2, the layer 1.1 and the top layer of the insulation layer 3 are essentially on the same plane.

Subsequently, in a layer 9 according to the illustrations g) and g1), spaced-apart upper contacting faces 4 and 6 as well as a further layer 1.1 of electrically conductive material (here copper) are applied by means of 3D printing to the upper surfaces of the two contacts 2a, the contact 2b of the semiconductor chip 2 and the strip-shaped contacting surface in the form of layer 1.1. Figure g) shows the section B-B according to FIG. g1). Corresponding to the height of the layers 4, 6 and 1.1, the ceramic insulation layer 3 is now applied between them and at their periphery to complete the layer L9, also by 3D printing, according to the illustrations h) and h1.

Figure 6A:
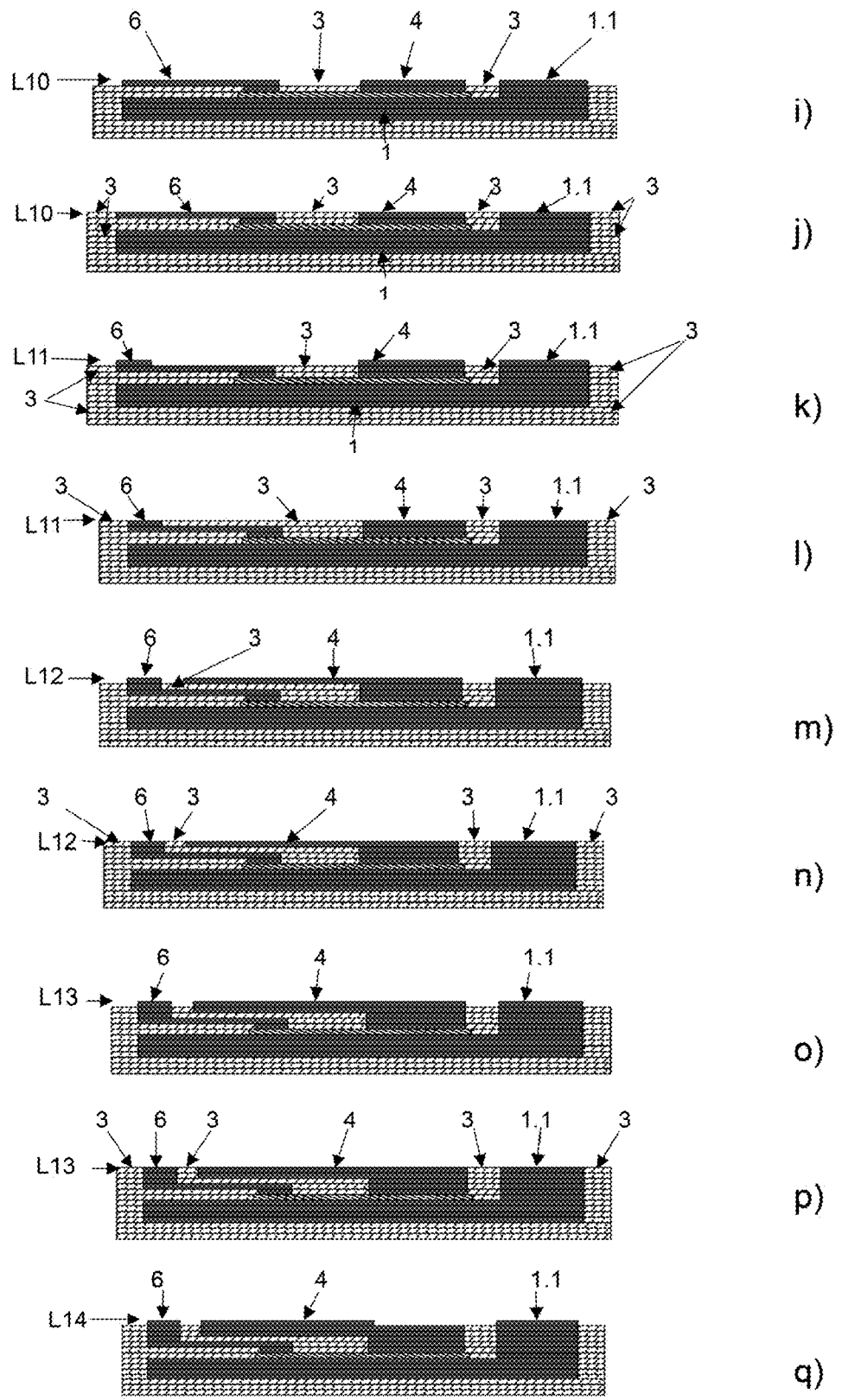
Figure 6B:
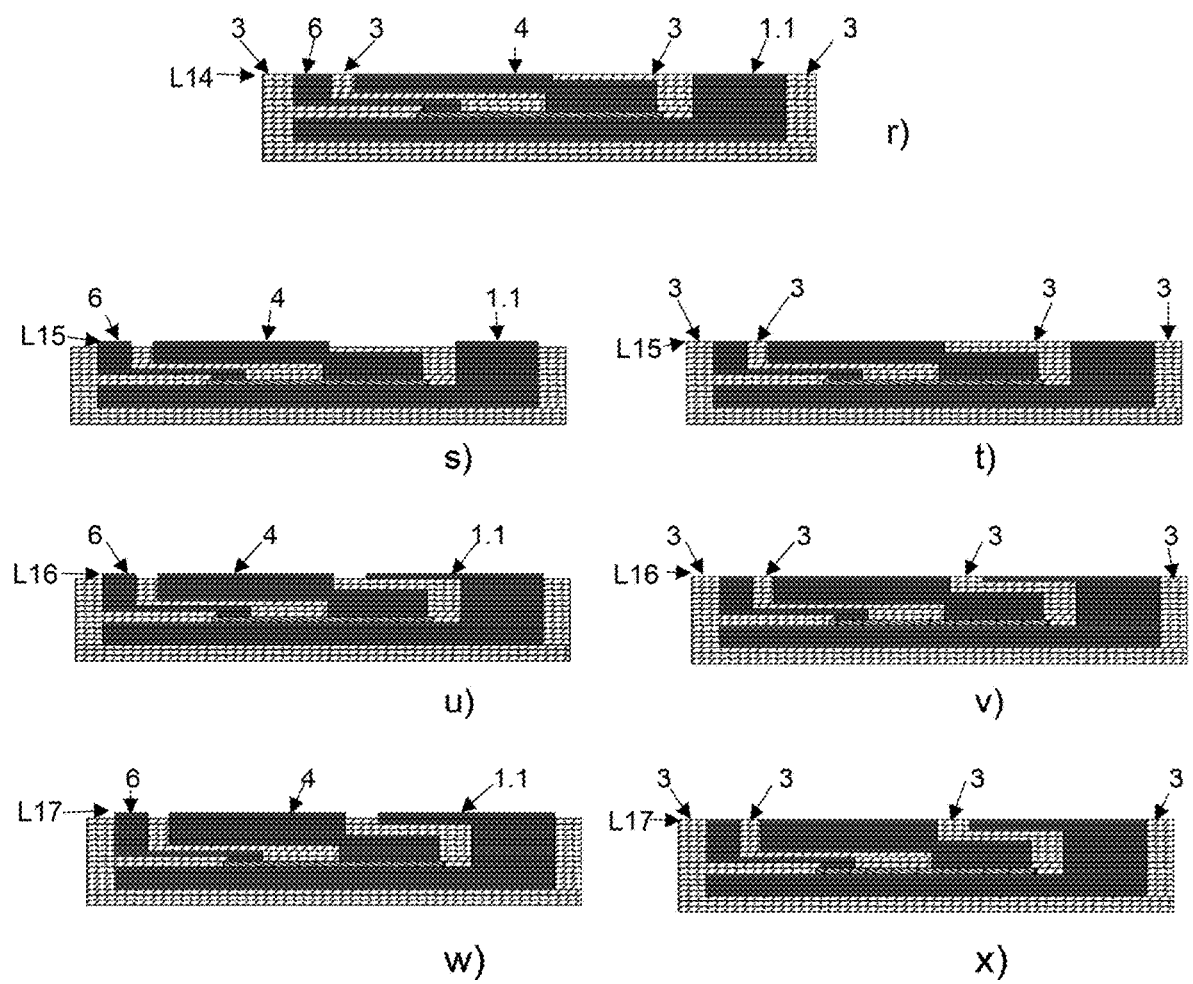

Through-platings to the upper side of the power electronic component to be produced are now built up via 3D multi-material printing from the upper contact faces 4, 6 and the layer 1.1, as shown in FIGS. 6A and 6B, by further layer-by-layer application of additional contact faces 4, 6 and 1.1 of electrically conductive material (here copper) and interposed ceramic insulation layers 3 in further layers L10 to L17, and always alternately by applying electrically conductive material and insulation layers 3. This is shown in depictions i) to x. For each layer L10 to L17, electrically conductive layers are printed on first, and the respective layer L10 to L17 is completed with a ceramic insulation layer 3, also printed on using multi-material 3D printing. The upper contact faces 4, 6 and the layer 1.1 of electrically conductive material and the ceramic insulation layer 3 in the respective layer preferably have the same layer thickness. The layer height may vary, though. The contact faces 4, 6 and layer 1.1 also extend over the upper surface of the ceramic insulation layer 3 in certain areas.

Figure 5:
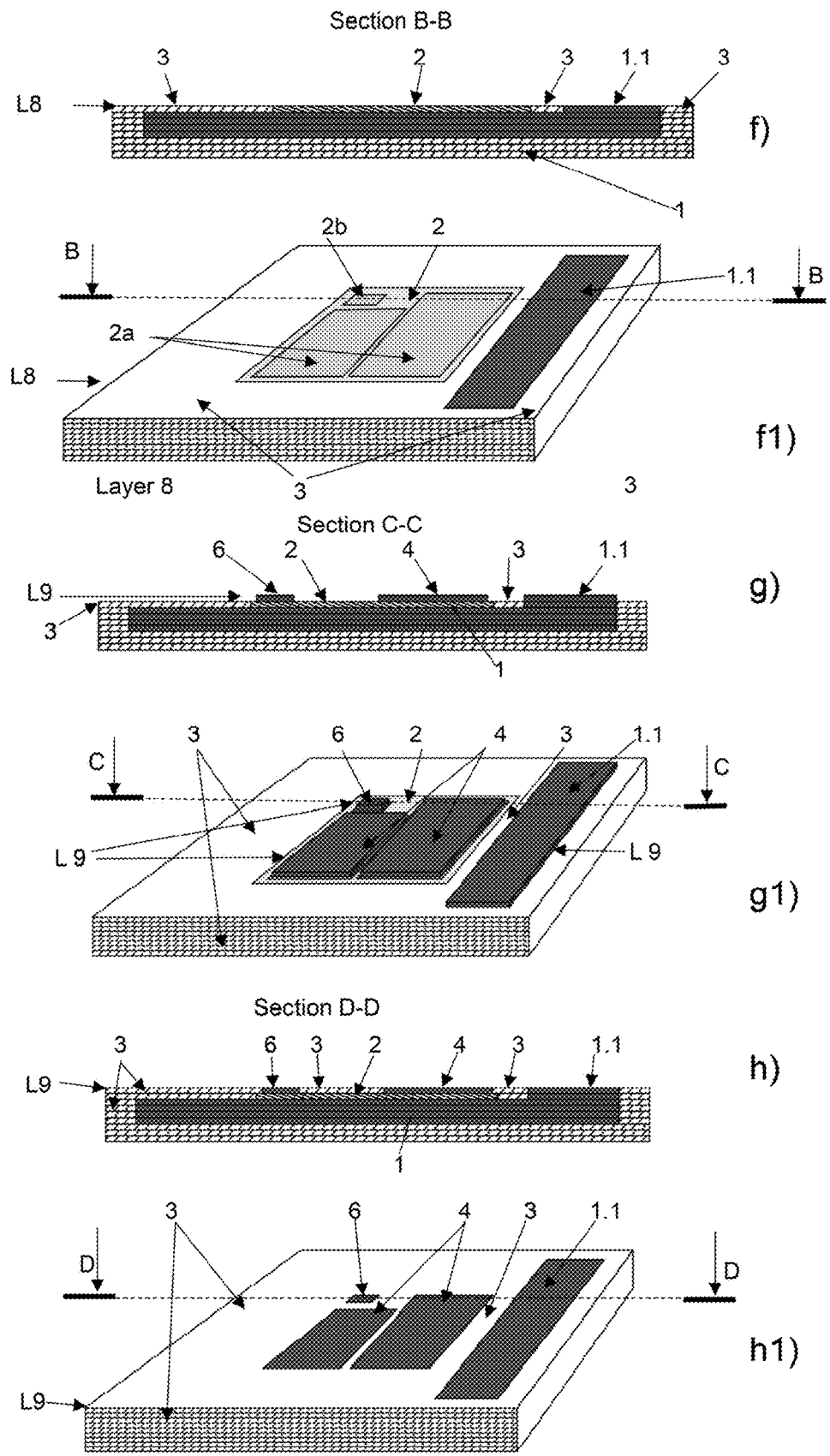

Figures h) and h1) in FIG. 5 and i) to x) in FIGS. 6A and 6B document the fourth process step 4, which is carried out here in several individual steps and in which the contact faces 4, 6 and the layer 1.1 of electrically conductive material are also printed onto the ceramic insulation layer 3 and the semiconductor chip 2 by means of the 3D multi-material printing process, which is implemented here, for example, in several layers L9 to L17.

Figure 7:
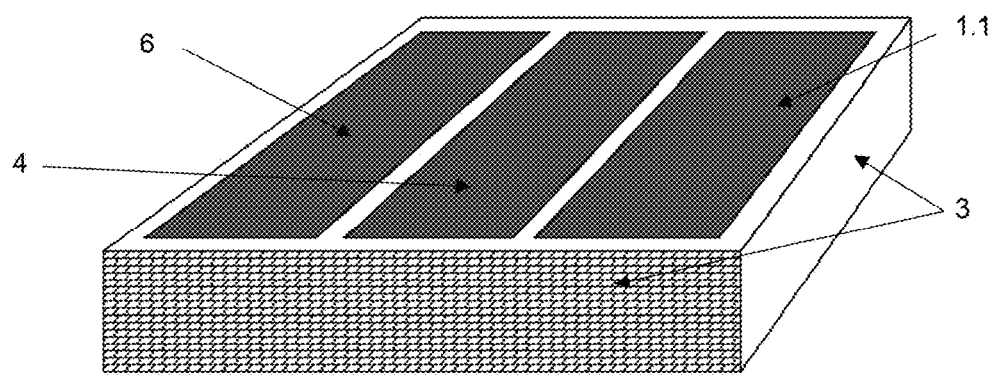

FIG. 7 shows the finished power electronic component, which
  has three upper contact faces 4, 6 and 1.1 on its upper side.
    The contact face 6 on the left here is connected to the gate contact 2b via underlying, inner contact faces 6 that connect them, and
  with a central contact face 4 here, which is connected to the source contacts 2a via corresponding, underlying inner contact faces 4 and
  with a further layer of electrically conductive material 1.1 on the right here, which is connected to the lower contact face 1 via the lower contacting layer 1.1 below it.

The underside, the side surfaces and the areas between the uppermost contact faces 4, 6 and layer 1.1 are made of ceramic insulation material and form a housing for the semiconductor chip, which is not visible here, and which directly adjoins the semiconductor chip.

The housing can be built with the manufacture of the component, whereby the fifth process step 5. is implemented in parallel with process steps 1 to 4.

Figure 8:
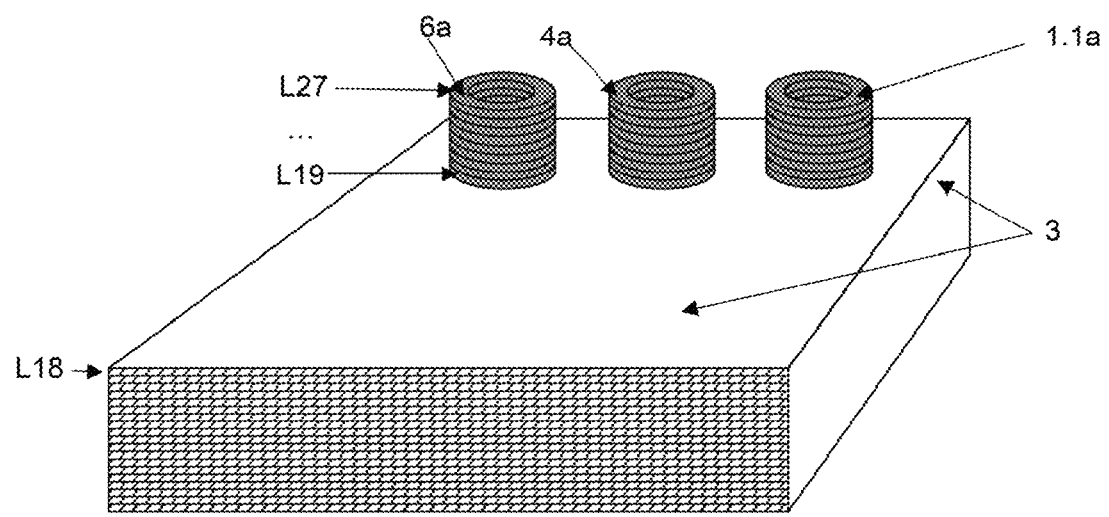

FIG. 8 shows another possible embodiment of the power electronic component in which an upper ceramic insulation layer 3 has been printed by applying a further layer L18 so that the housing also encloses the uppermost contact faces 4, 6 and 1.1. The uppermost insulation layer 3 has recesses 5, which are not visible, through which electrically conductive connection structures 1.1a, 4a, 6a project to the contacting faces 4, 6, not visible here, and to the layer 1.1. The electrically conductive connection structures 1.1a, 4a, 6a were created by applying further layers here from layer 19 of electrically conductive material up to a final layer L27. The first electrical connection structure 1.1a is electrically connected to the lower contact face 1 via underlying layers. The second electrical connection structure 4a is electrically connected to the source contact 2a via underlying layers and, for example, the third electrical connection structure 6a is connected to the gate contact 2b via underlying electrically conductive layers. Advantageously, the first, second and third connection structures 1.1a, 4a, 6a can be formed in such a way that they have a cavity in the interior which enables the subsequent screwing of screw lugs of the connection lines.

Finally, the power electronic component is sintered by means of heat treatment in the sixth process step 6.

The power electronic component may also have more than two source contacts 2a.

Furthermore, it is possible to provide more or less layers, depending on the configuration of the component to be created. It is also possible to adjust the order of materials in a layer accordingly. IT can be useful, as an example, for the electrically conductive layer to be printed first in one layer, followed by the insulating layer, while in the next layer it can be advantageous for the insulating material to be applied first and the electrically conductive material afterwards. The height of the layers can also vary, but for each layer, the top of the applied layers of electrically conductive material and ceramic should finish at the same height.

LIST OF REFERENCE NUMERALS

1 first, lower contact face
1.1 further layer of electrically conductive material
1.1a first electrical connection structure
2 semiconductor chip
2a source contacts
2b gate contact
3 ceramic insulation layer
4 second, upper contact face
4a second electrical connection structure
5 cutout
6 additional connection
6a third electrical connection structure
7 cooling fins
8 channel for coolant fluid
a distance
H power electronic component
L1 to L18 layers
L19 to L27 layers

The invention claimed is:

1. A method for contacting and packaging a semiconductor chip of a power electronic component, wherein the power electronic component has a first, lower contact face and a semiconductor chip positioned thereon, characterized in that a ceramic insulation layer, which surrounds the semiconductor chip along its circumference and extends over the first, lower contact face not covered by the semiconductor chip, is printed onto the first, lower contact face, and in that a second, upper contact face of the power electronic component is printed onto the ceramic insulation layer and the semiconductor chip, wherein the first, lower and second, upper contact face and the ceramic insulation layer are created in a printing process by means of a 3D multi-material printer such that, in a first method step, the first, lower contact face made of an electrically conductive material is produced by means of the multi-material printing process,
  in a second method step, the semiconductor chip is placed, oriented and positioned onto the first, lower contact face,
  in a third method step, a ceramic insulation layer, which surrounds the circumference of the semiconductor chip, is printed onto the first, lower contact face via the 3D multi-material printing process, a height of said ceramic insulation layer substantially corresponding to a height of the semiconductor chip, as a result of which a flat surface consisting of the upper side of the semiconductor chip and the ceramic insulation layer is formed as a support for the second, upper contact face,
  in a fourth method step, the second, upper contact face made of an electrically conductive material is printed onto the ceramic insulation layer and the semiconductor chip via the 3D multi-material printing process,
  in a fifth method step, a housing for the semiconductor chip is created by means of the printing process,
  in a sixth method step, the power electronic component is sintered by means of heat treatment.

2. The method according to claim 1, characterized in that a cutout for an additional connection is made in the second, upper contact face.

3. The method according to claim 2, characterized in that the additional connection is surrounded at the edges by the ceramic insulation layer and is insulated from the second, upper contact face.

4. The method according to claim 1, characterized in that the first, lower contact face and or second, upper contact face is produced from a conductive material.

5. The method according to claim 1, characterized in that cooling functionalities are introduced into the housing when the housing is created by means of the printing process.

* * * * *